(12) United States Patent
Ben Dhiab et al.

(10) Patent No.: US 12,429,952 B2
(45) Date of Patent: Sep. 30, 2025

(54) DEVICE FOR LOCALIZED FRICTION MODULATION VIA VIBRATIONS IN A VIBRATING INTERFACE WITH A CONTACT SURFACE

(71) Applicant: COMMISSARIAT A L'ENERGIE ATOMIQUE ET AUX ENERGIES ALTERNATIVES, Paris (FR)

(72) Inventors: Ayoub Ben Dhiab, Gif-sur-Yvette (FR); Charles Hudin, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/719,599

(22) PCT Filed: Dec. 13, 2022

(86) PCT No.: PCT/FR2022/052329
§ 371 (c)(1),
(2) Date: Jun. 13, 2024

(87) PCT Pub. No.: WO2023/111444
PCT Pub. Date: Jun. 22, 2023

(65) Prior Publication Data
US 2025/0138640 A1    May 1, 2025

(30) Foreign Application Priority Data
Dec. 14, 2021   (FR) ........................................ 2113426

(51) Int. Cl.
*G06F 3/0488*   (2022.01)
*G06F 3/01*   (2006.01)
*H10K 59/40*   (2023.01)

(52) U.S. Cl.
CPC ............. *G06F 3/016* (2013.01); *H10K 59/40* (2023.02)

(58) Field of Classification Search
CPC ........ G06F 3/016; G06F 3/0445; H10K 59/40
See application file for complete search history.

(56) References Cited

U.S. PATENT DOCUMENTS

2011/0012717 A1   1/2011   Pance et al.
2014/0062910 A1   3/2014   Yeo
(Continued)

FOREIGN PATENT DOCUMENTS

EP      3 446 195 B1      7/2020
WO     2018/178582 A1    10/2018

OTHER PUBLICATIONS

Hudin, "Local friction modulation using non-radiating ultrasonic vibrations", 2017 IEEE World Haptics Conference (WHC), pp. 19-24, 2017.

*Primary Examiner* — Abdul-Samad A Adediran
(74) *Attorney, Agent, or Firm* — BakerHostetler

(57) ABSTRACT

A device for local friction modulation via vibration includes a vibrating interface with a contact surface, a plurality of actuators with active surfaces that are arranged against this vibrating interface, designed to vibrate the vibrating interface in a transverse direction through the transmission of mechanical bending waves to create at least one local friction modulation on the contact surface, and a generator which generates a plurality of control signals for controlling the actuators. Each control signal comprises a carrier signal at a non-radiating frequency for the actuator that it controls. At least two of the actuators share an overlapping common portion of their active surfaces.

10 Claims, 8 Drawing Sheets

(56) References Cited

U.S. PATENT DOCUMENTS

| | | | |
|---|---|---|---|
| 2020/0050356 A1* | 2/2020 | Hudin | G06F 3/016 |
| 2022/0261081 A1* | 8/2022 | Casset | G06F 3/016 |
| 2022/0283639 A1* | 9/2022 | Ben Dhiab | G06F 3/0445 |

* cited by examiner

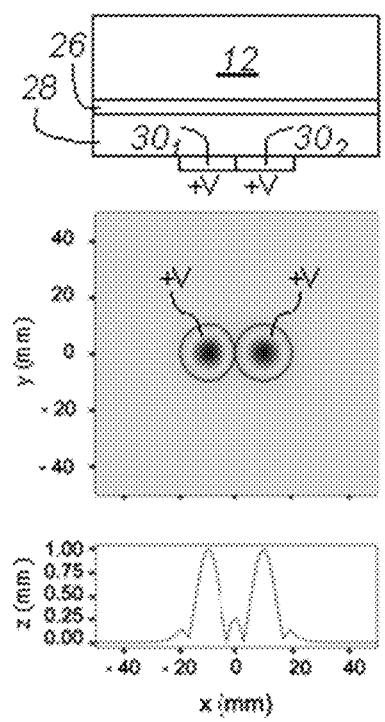

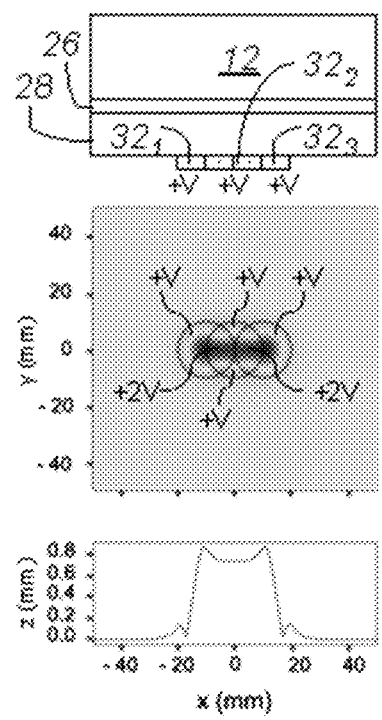

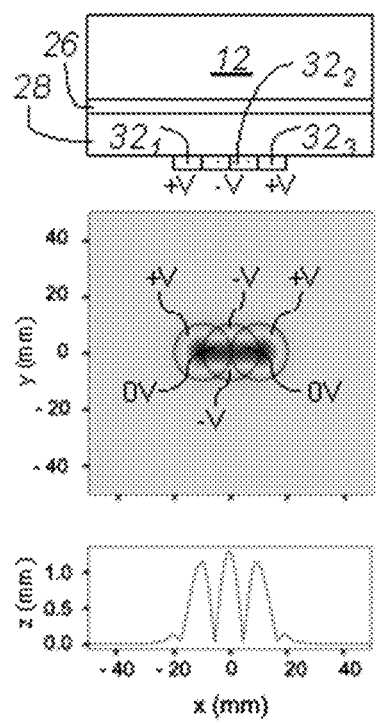

DEVICE FOR LOCALIZED FRICTION MODULATION VIA VIBRATIONS IN A VIBRATING INTERFACE WITH A CONTACT SURFACE

CROSS-REFERENCE TO RELATED APPLICATIONS

This application is a National Stage of International patent application PCT/FR2022/052329, filed on Dec. 13, 2022, which claims priority to foreign French patent application No. FR 2113426, filed on Dec. 14, 2021, the disclosures of which are incorporated by reference in their entireties.

FIELD OF THE INVENTION

The present invention relates to a device for local friction modulation via vibration.

BACKGROUND

The invention applies more particularly to a device comprising:
 a vibrating interface with a contact surface;
 a plurality of actuators with active surfaces arranged against said vibrating interface, designed to vibrate the vibrating interface in a transverse direction by emitting mechanical bending waves to create at least one local friction modulation on the contact surface; and
 a generator of several control signals for controlling the actuators.

One field of application concerns the acoustic lubrication of a haptic contact surface of an interactive interface, in which case the actuators are acoustic wave-emitting, preferably ultrasonic. Acoustic lubrication generally involves vibrating the contact surface at an ultrasonic frequency. This vibration, with an amplitude in the micron range, generates intermittent contact between a user's touch-sensitive limb, for example any one of their fingers, and the contact surface, resulting in a significant reduction in the apparent friction coefficient and facilitating movement of the finger over the contact surface. In this way, it is also possible to restore the sensation of texture when tactilely exploring a surface that is nonetheless smooth. By modulating this effect according to the position on the contact surface, it is also possible to give the illusion of a spatial variation in friction and therefore texture.

Another field of application is micromanipulation by acoustophoresis, wherein particles are moved by generation of localized vibrations on the contact surface of a vibrating support, in which case the actuators are also acoustic wave-emitting. In the remainder of the description, we shall concentrate mainly on acoustic lubrication, knowing that the general principles of the present invention apply without particular adaptation to acoustophoresis and to other technical fields where local friction modulation is conceivable.

In the most common implementations, however, the acoustic frequency used corresponds to a resonance frequency of the vibrating interface. This results in a large vibration amplitude, but an identical acoustic lubrication effect over the entire contact surface. The texture effect therefore arises from a temporal modulation correlated to the movement of a finger, and not from a spatial variation in friction. The consequence is that several fingers in contact with the surface are subjected to the same stimulus and therefore to the same sensation of texture. This approach is therefore reserved for single-finger tactile exploration.

An alternative solution to friction modulation via vibration is electrostatic modulation. This involves applying an electrical potential to an electrode located beneath the contact surface and separated from the user's finger(s) by a thin insulating layer of vibrating interface. As the human body is at a different electrical potential from that of the electrode, there is a potential difference across the insulator and the epidermis, creating an electrostatic attraction force. By increasing the contact force, the friction force is increased and the illusion of a textured contact surface is created. As this effect is localized precisely above the electrode, it's easy to place a network of electrodes beneath the contact surface and locally control friction modulation for spatial variation and multi-touch exploration.

However, this technology raises safety problems, due to the high voltages required for the thin insulating layer. The electrostatic attraction effect further has the disadvantage of being highly dependent on the user's electrical potential and the electrical resistance of the skin, which varies greatly over time and from person to person.

Vibration-based friction modulation therefore remains the most satisfactory technology, provided that it can be localized on the contact surface and varied spatially for multi-digital exploration. It is specifically a teaching of the patent document published under number WO 2018/178582 A1 and the paper by Charles Hudin entitled "Local friction modulation using non-radiating ultrasonic vibrations", published at the IEEE World Haptics Conference held in Munich (DE) from Jun. 6 to 9, 2017, to allow friction modulation to be localized.

According to this teaching, each control signal comprises a carrier signal at a non-radiating frequency for the actuator that it controls. By "non-radiating frequency" it is meant a frequency which, outside a zone of the contact surface covered by this actuator, generates destructive interference from the mechanical bending waves emitted, so that the amplitude of the vibrations generated by this actuator outside the covered zone is at least 10 dB, advantageously at least 80 dB and preferably even at least 100 dB, less than the maximum amplitude of the vibrations generated by this actuator in the covered zone, in particular at its center.

Such non-radiating emissions are described in other fields of travelling and evanescent wave physics, notably in acoustics and electromagnetics. The aforementioned teaching consists in using these non-radiating emissions to locally modulate the apparent friction coefficient on the surface of a vibrating interface.

As it is well known, the non-radiating carrier frequency of a control signal for a given actuator is independent of the extent and boundary conditions of the vibrating interface against which this actuator is arranged. It depends on the thickness of this interface, its mechanical properties such as Young's modulus, Poisson's ratio and density, as well as the mechanical properties and dimensions of the actuator. It can take on an infinite number of values, given theoretically by solving a system of equations with four unknowns resulting from axisymmetric solutions of the bending wave propagation equation in a thin plate.

More precisely, for the purposes of this calculation, space is divided into two zones: the first one is that covered by the actuator, which is considered circular; the second one is that outside the first one; the boundary between these two zones is the circular periphery of the actuator. In each of the two zones, the out-of-plane displacement of the bending waves is defined by the Kirchhoff-Love propagation equation. Since the actuator is circular and the plate can be considered infinite, only the axisymmetric solutions of this equation are considered, which take on a finite value at the center of the actuator and as the distance from the actuator tends towards infinity. Four constants then remain to be determined: two describing the vibration field in the first zone and two in the second zone. These four constants are linked by four continuity equations at the boundary between the two zones: continuity of displacement, continuity of its derivative, continuity of bending moment and continuity of internal shear force. According to the well-known "pin force" model, as described by Victor Giurgiutiu in several of his articles and books, controlling the actuator with a voltage signal V creates a bending moment M on its circular periphery, which is added to those of the vibrating interface. The result is a system of four equations with four unknowns. By solving this system numerically, the four constants to be determined are obtained, and thus the shape of the vibration field inside and outside the actuator. One of these constants corresponds to the amplitude of the radiated wave. Non-radiating frequencies are those which cancel this constant.

It is then up to the person skilled in the art to demonstrate that, in the case of a circular piezoelectric actuator which is sufficiently thin in relation to the thickness of the vibrating interface against which it is arranged for its stiffness and mass to be negligible compared with those of the vibrating interface, the analytical resolution of this system of equations produces the following equation (1) which gives the possible values f of non-radiating carrier frequencies for this actuator:

$$f = \frac{1}{2\pi}\sqrt{\frac{D}{\rho_S}}\left(\frac{\alpha}{R}\right)^2,$$

where R is the radius of the circular actuator, D is the stiffness constant of the vibrating interface, $\rho_s$ is its mass per unit area and a is a constant that takes a priori an infinite number of discrete values (3.83; 7.02; 10.17; . . . ) corresponding to as many non-radiating carrier frequencies. This constant $\alpha$ corresponds to the values x that cancel out the first-order Bessel function, J1(x). There are an infinite number of such values. In practice, it is advantageous to select the first non-radiating frequency value in the ultrasonic range, i.e. above 16 kHz, or even above 20 KHz.

The problem with this approach is that the vibration amplitude of each actuator decreases significantly within the area it covers, from its center to its edges. Thus, even when several actuators are touching edge to edge, particularly when they are hexagonal and arranged in a honeycomb tiling, sliding a finger over two neighboring actuators that are touching each other reveals a transition zone where the friction modulation is weaker.

An intuitive solution would be to reduce the size of the actuators, so that the contact zone between the finger and the vibrating interface covers several actuators, thus smoothing out discontinuities. But, as equation (1) above shows, the non-radiating frequency is inversely proportional to the square of the radius of the actuator to which it applies. Reducing the size of actuators therefore requires a significant increase in the device's operating frequency, and therefore in the supply current and power consumption. To remain within acceptable power ranges, the size of each actuator must remain on the scale of the pulp of a finger, so this intuitive solution is inapplicable.

It may therefore be desirable to provide a device for local friction modulation via vibration, so as to avoid at least some of the above-mentioned problems and constraints.

SUMMARY OF THE INVENTION

A device for local friction modulation via vibration is therefore proposed, comprising:
  a vibrating interface with a contact surface;
  a plurality of actuators with active surfaces arranged against said vibrating interface, designed to vibrate the vibrating interface in a transverse direction by the emission of mechanical bending waves to create at least one local friction modulation on the contact surface; and
  a generator of several control signals for controlling the actuators;
wherein each control signal comprises a carrier signal at a non-radiating frequency for the actuator that it controls; and
wherein at least two of the actuators share an overlapping common portion of their active surfaces.

Thus, by overlapping the active surfaces of several neighboring actuators, it is possible to create a more constant vibration field, without a dead zone of transition between actuators in which the friction modulation is felt to be weaker. In practice, this is usually achieved not by mechanically overlapping independent actuators, which is difficult to achieve, but by overlapping the electrode patterns that receive the control signals.

Furthermore, it should be noted that in the targeted applications, the supply voltages and amplitudes of the control signals remain sufficiently low to consider the overlaps as linear. In this case, the vibration amplitude is locally proportional to the control voltage, and the vibration field produced by several overlapping actuators results locally from the sum of the individual contributions of the signals controlling them.

Optionally, the actuators are arranged in a double tiling of their circular active surfaces of equal radius R:
  a first matrix tiling, wherein each active surface touches its neighbor(s) at a point;
  a second matrix tiling, identical to but overlapped with the first matrix tiling by shifting a distance equal to the radius R in both row and column directions of the first matrix tiling.

Also optionally, the actuators are arranged in a triple tiling of their hexagonal active surfaces of equal length L of each hexagon side:
  a first honeycomb tiling wherein each active surface touches its neighbor(s) on one side;
  two other identical honeycomb tilings identical but overlapped with the first honeycomb tiling by shifting a distance equal to the length L in two of the three directions defined by the hexagons of the first honeycomb tiling.

Also optionally, the tiling overlapping constitutes juxtaposed active surface portions, each belonging to one or more actuator(s), and materialized by a layer of electrodes, one electrode per active surface portion, each electrode being supplied by an additive contribution of the control signal(s) of the actuator(s) associated with the active surface portion which it materializes.

Also optionally, each active surface portion is triangular, thus forming a regular triangular cut-out of electrodes resulting from the overlapping of the three honeycomb tilings, and belongs to at most three hexagonal actuators centered respectively at most on its three vertices, through each of which it is combined with five other triangular surface portions to form each actuator to which it belongs.

Also optionally, at least two actuators sharing an overlapping common portion of their active surfaces have their respective control signals generated in phase opposition.

Also optionally, the generator of control signals is designed to generate periodic signals frequency-centered on their non-radiating frequency and modulated at low frequency according to at least one modulation frequency less than or equal to 1 kHz.

Also optionally, each actuator is coupled to a passive shunt flip-flop system.

The actuators can also optionally include ultrasonic transducers, in particular piezoelectric or magnetostrictive transducers.

Also optionally, the vibrating interface comprises a display plate with organic light-emitting diode technology.

BRIEF DESCRIPTION OF THE DRAWINGS

The invention will be better understood with the aid of the following description, given solely by way of example and made with reference to the appended drawings wherein:

FIG. 4A illustrates an example of spatial distribution of vibrations on a contact surface obtained by activating two circular actuators using two control signals each comprising a carrier signal of non-radiating frequency, when the two actuators are in contact but do not have a common portion of their active surfaces overlapped on each other, FIG. 4B illustrates an example of spatial distribution of vibrations on a contact surface obtained by activating three circular actuators using three control signals, each comprising a carrier signal of non-radiating frequency, when the three actuators are in contact and have overlapping common portions of their active surfaces in pairs, according to a first alternative embodiment of the present invention, FIG. 4C illustrates an example of spatial distribution of vibrations on a contact surface obtained by activating three circular actuators using three control signals, each comprising a carrier signal of non-radiating frequency, when the three actuators are in contact and have overlapping common portions of their active surfaces in pairs, according to a second alternative embodiment of the present invention.

DETAILED DESCRIPTION

Figure 1:
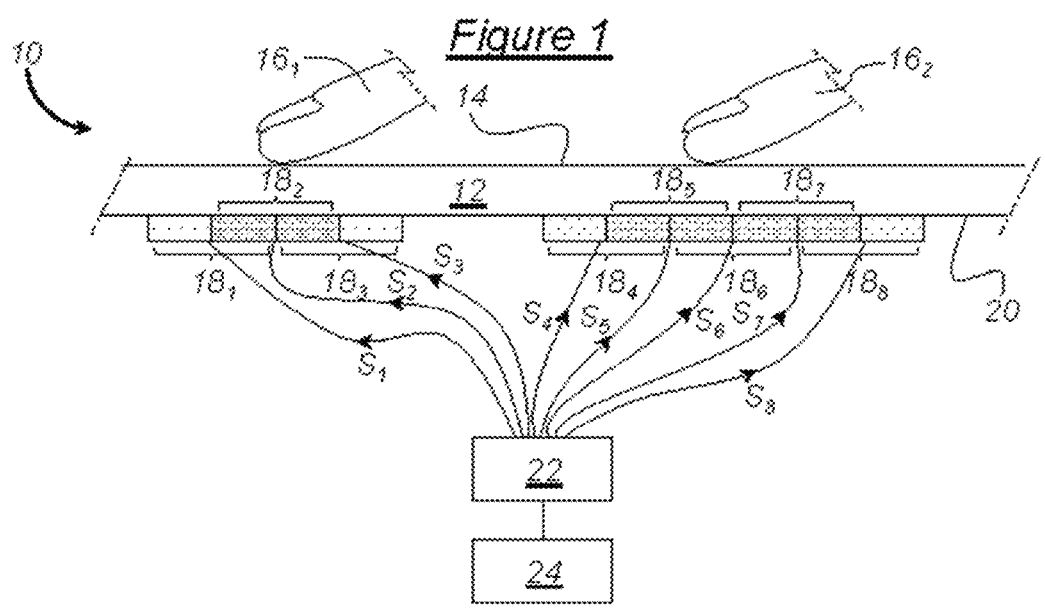
FIG. 1 shows a schematic side view of the general structure of a device for local friction modulation by vibration in a vibrating interface with a contact surface, according to one embodiment of the invention.

The highly simplified schematic representation of a device 10 for local friction modulation by vibration illustrates a side view in FIG. 1 of a vibrating interface 12, for example a touch-sensitive OLED (for "Organic Light-Emitting Diode", i.e. according to an organic light-emitting diode technology) screen plate, having an upper contact surface 14 over which at least one user's finger $16_1$, $16_2$ or any other touch-sensitive interaction limb can slide.

In the illustrated example, the contact surface 14 is flat, but it can take on any desired curvature depending on the intended application, as the vibrating interface 12 can itself be a tactile shell of any three-dimensional shape and of several materials such as glass, different types of plastic, metal, ceramic or others.

A plurality of actuators $18_1$, $18_2$, $18_3$, $18_4$, $18_5$, $18_6$, $18_7$, $18_8$ are arranged against a lower surface 20, opposite the upper contact surface 14, of the vibrating interface 12. They are designed to vibrate the vibrating interface 12 in a transverse direction by emission of mechanical bending waves to create at least one local friction modulation on the contact surface 14 when excited by control signals. In a manner known per se, this vibration is possible when the vibrating interface is sufficiently thin in relation to its own lateral dimensions and the dimensions of the actuators, for example less than one millimeter thick.

These are, for example, piezoelectric ultrasonic transducers 1 μm to 1 mm thick, each comprising a ceramic layer, for example of the PZT (Lead Zirconate Titanate) or AlN (Aluminum Nitride) type, embedded between two electrode layers, one referred to as the lower electrode, in contact with the lower surface 20, and the other as the upper electrode. They thus each have an active surface materialized by the common surface of their opposite lower and upper electrodes, this active surface being maintained by the lower electrode in contact with the lower surface 20 of the vibrating interface 12, for example by bonding or thin-film deposition.

Alternatively, they could be magnetostrictive, in which case the active surface of such a transducer is its external surface portion in direct contact with the lower surface 20 of the vibrating interface 12.

One of the electrodes of each actuator is connected to ground, i.e. to a reference potential, while the other is connected to a control signal generator 22, itself supplied by a power source 24. This generator 22 delivers, for example, as many control signals $S_1$, $S_2$, $S_3$, $S_4$, $S_5$, $S_6$, $S_7$, $S_8$ as actuators $18_1$, $18_2$, $18_3$, $18_4$, $18_5$, $18_6$, $18_7$, $18_8$. It is generally the lower electrode that is connected to ground and the upper electrode that is connected to the generator 22, since the latter is normally the most easily accessible for individual electrical connection.

Each control signal $S_i$ comprises a harmonic carrier signal at a non-radiating frequency for the actuator $18_i$ that it controls. As previously defined, this frequency generates, outside a zone of the contact surface covered by this actuator $18_i$, i.e. precisely the zone of contact surface 14 which is opposite the active surface of actuator $18_i$ and of the same geometry, destructive interference of the mechanical bending waves emitted so that the amplitude of the vibrations generated by this actuator outside the covered zone is at least 10 dB, advantageously at least 80 dB and preferably even at least 100 dB, lower than the maximum amplitude of the vibrations generated by this actuator in the covered zone.

The carrier signal of each control signal is sinusoidal, for example, or more generally periodic and centered on its non-radiating frequency, which is advantageously ultrasonic, i.e. above 16 kHz, or even above 20 KHz. Each control signal may further result from low-frequency modulation of its carrier signal, i.e. at least one modulation frequency less than or equal to 1 KHz. Such modulation in the tactile perception range makes it possible to reproduce a particular texture for desired haptic feedback in addition to acoustic lubrication.

Furthermore, as can be seen in FIG. 1, at least two of the actuators have an overlapping common portion of their active surfaces. More specifically, actuators $18_1$ and $18_2$ overlap, as do actuators $18_2$ et $18_3$. However, actuators $18_1$ and $18_3$ touch but do not overlap. As a result, the three actuators $18_1$, $18_2$ and $18_3$ form a first localized haptic interaction zone with a user's first finger $16_1$. More precisely too, actuators $18_4$ and $18_5$ overlap, as do actuators $18_5$ and $18_6$, $18_6$ and $18_7$, $18_7$ and $18_8$. On the other hand, actuators $18_4$ et $18_6$ touch but do not overlap, nor do actuators $18_6$ and $18_8$. As a result, the five actuators $18_4$, $18_5$, $18_6$, $18_7$ et $18_8$ form a second zone of localized haptic interaction with a second user's finger $16_2$.

Since the two zones of localized haptic interaction do not necessarily touch, the haptic interaction can be different from one zone to the other, thanks to a differentiation of control signals, in particular through their low-frequency modulation. The result is the possibility of multi-digital exploration.

Figure 2:
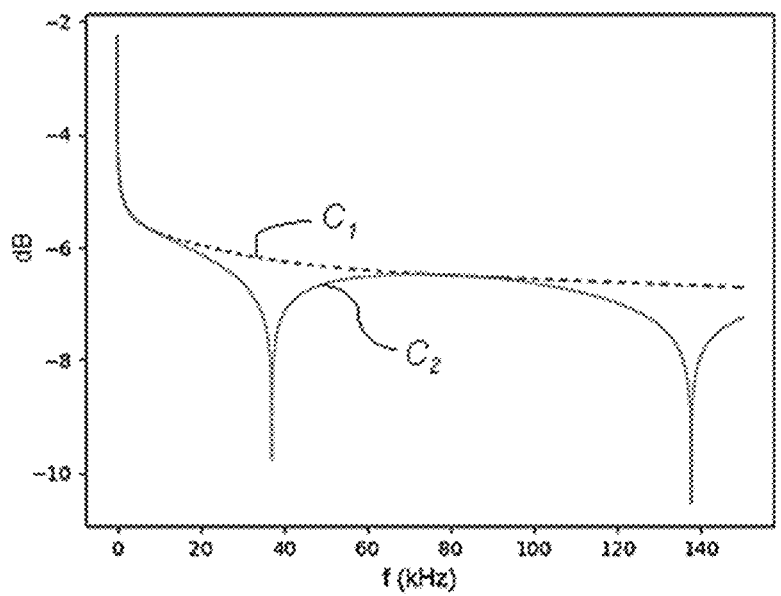
FIG. 2 is a diagram illustrating an example of the vibratory response of a circular actuator of the device shown in FIG. 1 as a function of the carrier frequency of its control signal.
Figure 3A:
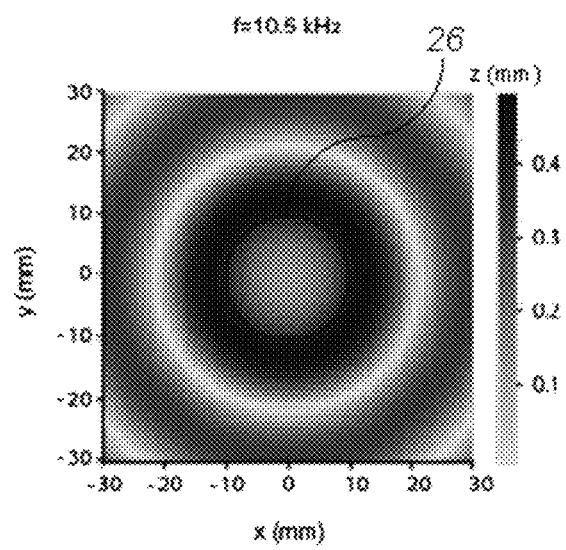
FIG. 3A illustrates an example of spatial distribution of vibrations on a contact surface obtained by activating an isolated circular actuator of the device shown in FIG. 1 using a control signal comprising a radiating frequency carrier signal.

The diagram shown in FIG. 2 illustrates this property of non-radiating frequencies that exist for a given actuator. The dotted curve $C_1$ shows, in decibels relative to a reference amplitude, the evolution of the amplitude of bending vibrations generated at the center of the active surface covered by the actuator in question, as a function of the carrier frequency of the control signal that activates it. The solid line curve $C_2$ shows the evolution of the amplitude of bending vibrations generated outside the active surface covered by the actuator in question, as a function of the carrier frequency of the control signal that activates it. Curve $C_2$ shows at least two non-radiating frequencies for the actuator in question, one at $f_1$=37.1 KHz and the other at $f_2$=137.7 kHz Thus, at any radiating carrier frequency f, for example equal to 10.5 kHz in the diagram of FIG. 2, FIG. 3A illustrates a spatial distribution of bending vibrations extending up to 30 mm from the center of a circular actuator of 10 mm radius which can be obtained on the contact surface 14 against which this actuator is arranged when activated. The vibrations extend well beyond the periphery 26 of its active surface, even beyond the 30 mm shown. This can be any of the actuators shown in FIG. 1.

Figure 3B:
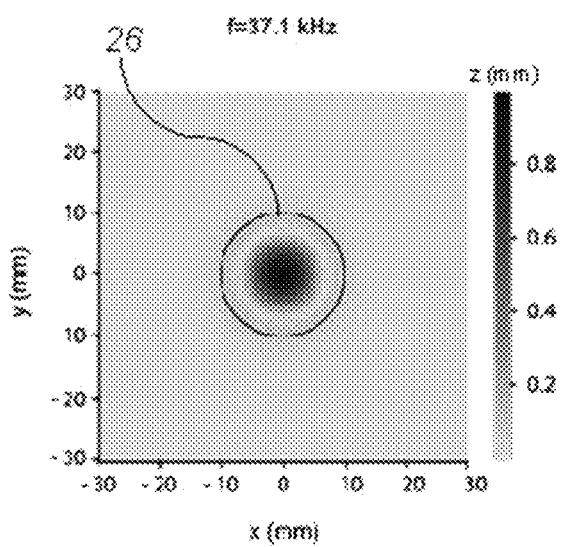
FIG. 3B illustrates an example of spatial distribution of vibrations on a contact surface obtained by activating an isolated circular actuator of the device shown in FIG. 1 using a control signal comprising a non-radiating frequency carrier signal.

But when the carrier frequency f of the control signal is precisely equal to $f_1$=37.1 KHz, i.e. non-radiating, FIG. 3B illustrates the resulting spatial distribution of bending vibrations up to 30 mm from the center of the same actuator. They are no longer visible or perceptible outside the actuator's active surface. In fact, they are already greatly reduced before reaching the periphery 26.

FIG. 4A thus illustrates the spatial distribution of vibrations resulting from two circular actuators such as the one in FIG. 3B arranged edge-to-edge, i.e. touching each other but having no overlapping common portion of their active surfaces, when respectively activated by two identical control signals with a non-radiating carrier frequency f equal to $f_1$=37.1 kHz, of common amplitude +V and in phase. It can be seen in the lower part of FIG. 4A that the bending vibration amplitude, along the normal z to the contact surface 14, unfortunately shows a pronounced touch-sensitive central decay between the two actuators, creating a transition zone where the friction modulation is weaker.

It should be noted that in this concrete example of implementation, each actuator is a piezoelectric transducer defined and delimited by its upper electrode. As a matter of fact and as shown in the side view at the top of FIG. 4A, the lower electrode 26 bonded to the vibrating interface 12 is common to both actuators, as is the ceramic layer 28. Two adjacent upper electrodes in the form of circular pellets $30_1$, $30_2$ are cut from an upper conductive layer. They form and delimit the active surfaces of the two actuators. Alternatively, each actuator could have its own lower electrode and ceramic layer, only the potential difference between the two electrodes of the same actuator being relevant for the purposes of this invention.

According to the general principles of the present invention, FIG. 4B illustrates the spatial distribution of vibrations resulting from several actuators such as the one in FIG. 3B, at least two of which advantageously have an overlapping common portion of their active surfaces, when they are respectively activated using identical control signals at a non-radiating carrier frequency f equal to $f_1$=37.1 KHz. More precisely, and by way of a simple illustrative example, three circular actuators such as the one shown in FIG. 3B are arranged linearly in such a way that the first and third are edge-to-edge, while the second is overlapped between the other two. The second actuator thus has a first overlapping common active surface portion with the first actuator, a second overlapping common active surface portion with the third actuator and two non-overlapping active surface portions. Each of the first and third actuators also retains a non-overlapping active surface portion.

The three actuators are respectively activated by three control signals of common amplitude +V and in phase. As a result of the additive property of the control signal contributions, the four non-overlapping actuator active surface portions are supplied with +V control amplitude, while the two aforementioned common active surface portions are supplied with +2V control amplitude. Thus, it can be seen in the lower part of FIG. 4B that the bending vibration amplitude, along the normal z to the contact surface 14, no longer shows a touch-sensitive decay between the three actuators, thanks to their two-by-two overlapping.

Alternatively, FIG. 4C illustrates the spatial distribution of vibrations resulting from the same overlapping of three actuators as shown in FIG. 4B, when they are respectively activated with control signals at the same non-radiating carrier frequency f.

However, the control signal for the second actuator is in phase opposition to the other two. In other words, the first and third control signals are of common amplitude +V and in phase, while the third control signal can be considered of the same amplitude and in phase opposition or of amplitude −V and in phase. As a result, due to the additive property of the control signal contributions, the four non-overlapping actuator active surface portions are supplied with +V control amplitude, while the two aforementioned common active surface portions are supplied with 0V control amplitude. Thus, it can be seen in the lower part of FIG. 4C that the bending vibration amplitude, along the normal z to the contact surface 14, shows two decreases between the three actuators. However, they are so narrow that they are eventually not touch-sensitive, or at least much less than in the case of FIG. 4A.

It should also be noted that, in the concrete implementation example shown in FIGS. 4B and 4C, each actuator is a piezoelectric transducer defined and delimited by its upper electrode. As shown in the side view at the top of FIGS. 4B and 4C, the lower electrode 26 bonded to the vibrating interface 12 is common to all three actuators, as is the ceramic layer 28. Three overlapped upper electrodes in the form of circular pellets 321, 322, 323 are cut out in an upper conductive layer and form the active surfaces of the three actuators, functionally supplied respectively by three control signals, identical and in phase in the variant of FIG. 4B, identical and with the second control signal in phase opposition to the other two in the variant of FIG. 4C. In practice and in a perfectly equivalent way, it is in fact the six juxtaposed active surface portions which are advantageously cut out in the upper conductive layer and supplied with six control signals. The two overlapped active surface portions are respectively supplied at +2V and the other four at +V in the FIG. 4B variant, while they are supplied at 0V and the other four at +V in the FIG. 4C variant.

It can thus be seen that the variant shown in FIG. 4C has a slightly less efficient acoustic lubrication profile than the variant shown in FIG. 4B (while remaining significantly more efficient than the variant shown in FIG. 4A), but with a clear advantage in terms of voltage levels and power consumption: no power supply to the two overlapped active surface portions in variant 4C, compared with two +2V power supplies in variant 4B.

Figure 5:
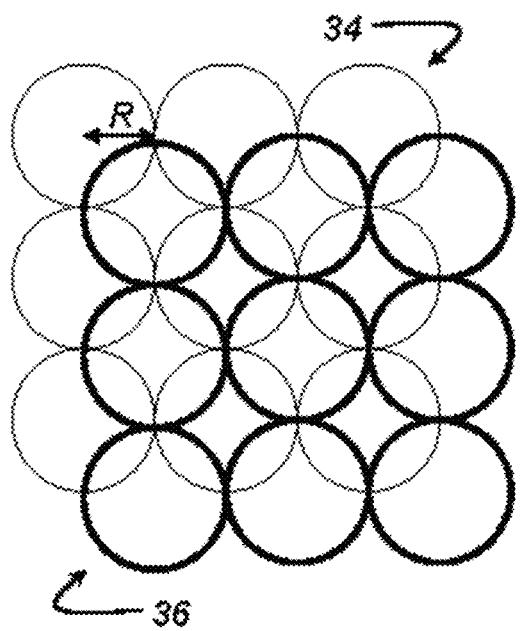
FIG. 5 shows a schematic front view of an example of a two-dimensional arrangement, in accordance with the general principles of the present invention, of circular actuators against a vibrating interface of a local friction modulation via vibration device.

In accordance with the general principles of the present invention, FIG. 5 illustrates in front view an example of a two-dimensional arrangement of circular actuators overlapped against a vibrating interface such as interface 12.

More precisely, the actuators are arranged in a double tiling of their circular active surfaces of equal radius R. A first matrix tiling 34 in which each circular active surface touches its neighbor(s) at a point is shown in thin lines. A second matrix tiling 36, identical to but overlapped on the first one by shifting a distance equal to the radius R in both row and column directions of the first matrix tiling 34, is shown in thick lines.

It can be seen that, apart from the actuators located at the edges of the two tilings 34 and 36, each circular actuator of one of the two tilings 34 or 36 has five juxtaposed active surface portions or electrodes forming the actuator disc, one of which is central without overlapping and four peripheral, each overlapped with an adjacent actuator of the other of the two tilings 36 or 34. In practice, the resulting pattern of active surface portions to be cut into the upper conductive layer is quite complex to achieve, but the circular shape of the resulting actuators optimizes the effect of the non-radiating frequency on the absence of vibrations outside the contact surface portion 14 to be acoustically lubricated.

Figure 6:
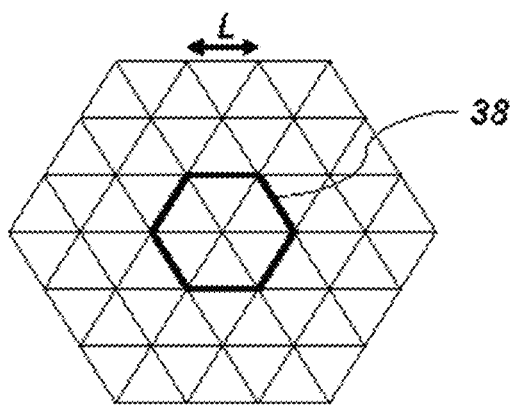
FIG. 6 shows a schematic front view of an example of a two-dimensional arrangement, in accordance with the general principles of the present invention, of hexagonal actuators against a vibrating interface of a local friction modulation via vibration device.

Also in accordance with the general principles of the present invention, FIG. 6 illustrates in front view an example of a two-dimensional arrangement of overlapped hexagonal actuators against a vibrating interface such as interface 12. The hexagonal shape is a good approximation to the circular shape to maintain an acceptable effect of the non-radiating frequency on the high vibration attenuation outside the contact surface portion 14 to be acoustically lubricated. From this point of view, the hexagonal shape is sub-optimal. On the other hand, from the point of view of tiling of the contact surface 14 and the amplitude of the vibrations that can be obtained, it is optimal since each honeycomb tiling resulting from a juxtaposition of hexagonal actuators covers the entire portion of contact surface 14 to be lubricated.

More precisely, the actuators are arranged in a triple tiling of their hexagonal active surfaces of equal length L of each hexagon side. In a first honeycomb tiling, each hexagonal actuator active surface touches its neighbor(s) on one side. The other two honeycomb tilings are identical, but overlapped on the first by shifting a distance equal to the length L in two of the three directions defined by the hexagons of the first honeycomb tiling. It can be seen that, apart from the actuators located at the edges of the honeycomb tilings, each hexagonal actuator 38 of any one of the three tilings has six juxtaposed triangular active surface portions or electrodes forming the actuator hexagon, each overlapped on two adjacent actuators of the other two tilings.

In practice, the resulting pattern of active surface portions to be cut into the upper conductive layer is very simple to achieve, since each active surface portion is triangular, thus forming a regular triangular cutout of upper electrodes resulting from the overlapping of the three honeycomb tilings. Each active surface portion belongs to at most three hexagonal actuators centered respectively at most on its three vertices, through each of which it is combined with five other triangular surface portions to form each actuator to which it belongs.

It should be noted that in the two examples shown in FIGS. 5 and 6, the overlapped tilings form juxtaposed active surface portions, each belonging to one or more actuator(s), and materialized by a specific cutout in the aforementioned upper conductive layer of electrodes, one electrode per active surface portion, each electrode being supplied with a control signal corresponding to the additive contribution of the control signal(s) of the actuator(s) associated with the active surface portion it materializes. In particular, the triangular mesh obtained using hexagonal honeycomb actuators on three tilings makes it possible to position virtually all of them by grouping the corresponding triangular surface portions by six.

Some non-limiting examples of spatial vibration distributions that can be obtained by overlapping hexagonal actuators will now be illustrated.

Figure 7A:
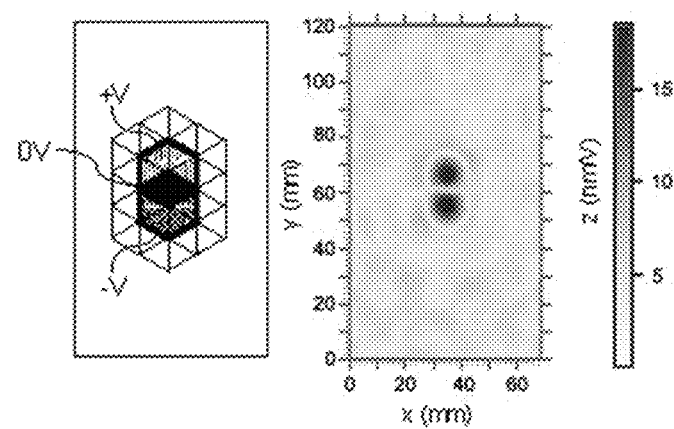
FIG. 7A illustrates an example of spatial distribution of vibrations on a contact surface obtained by activating two hexagonal actuators using two control signals, each comprising a carrier signal of non-radiating frequency, when the two actuators are in contact and have overlapping common portions of their active surfaces, according to a first alternative embodiment of the present invention.

FIG. 7A illustrates an example in which two hexagonal actuators are overlapped on two triangular active surface portions and are controlled in phase opposition. Thus, the four non-overlapping triangular active surface portions of the first hexagonal actuator are supplied with +V (textured in medium gray), the four non-overlapping triangular active surface portions of the second hexagonal actuator are supplied with −V (textured in dark gray) and the two overlapping triangular active surface portions are supplied with 0V (textured in black). The result is a fairly homogeneous pattern of localized vibrations for optimized energy consumption. Lateral dimensions of the contact surface are expressed in mm, while vibration amplitudes are expressed in nm/V.

Figure 7B:
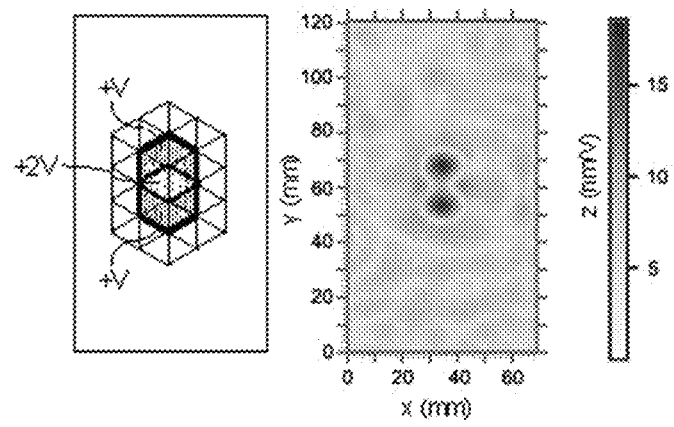
FIG. 7B illustrates an example of spatial distribution of vibrations on a contact surface obtained by activating two hexagonal actuators using two control signals, each comprising a carrier signal of non-radiating frequency, when the two actuators are in contact and have overlapping common portions of their active surfaces, according to a second alternative embodiment of the present invention.

FIG. 7B illustrates an example in which the same two hexagonal actuators are overlapped on the same two triangular active surface portions and are controlled in phase. Thus, the four triangular active surface portions of the first hexagonal actuator without overlapping are supplied with +V (textured in medium gray), the four triangular active surface portions of the second hexagonal actuator without overlapping are supplied with +V (textured in medium gray) and the two overlapping triangular active surface portions are supplied with +2V (textured in light gray). The pattern of localized vibrations is less homogeneous than the previous one, with less optimal energy consumption. Lateral dimensions of the contact surface are still expressed in mm, while vibration amplitudes are expressed in nm/V.

Figure 8:
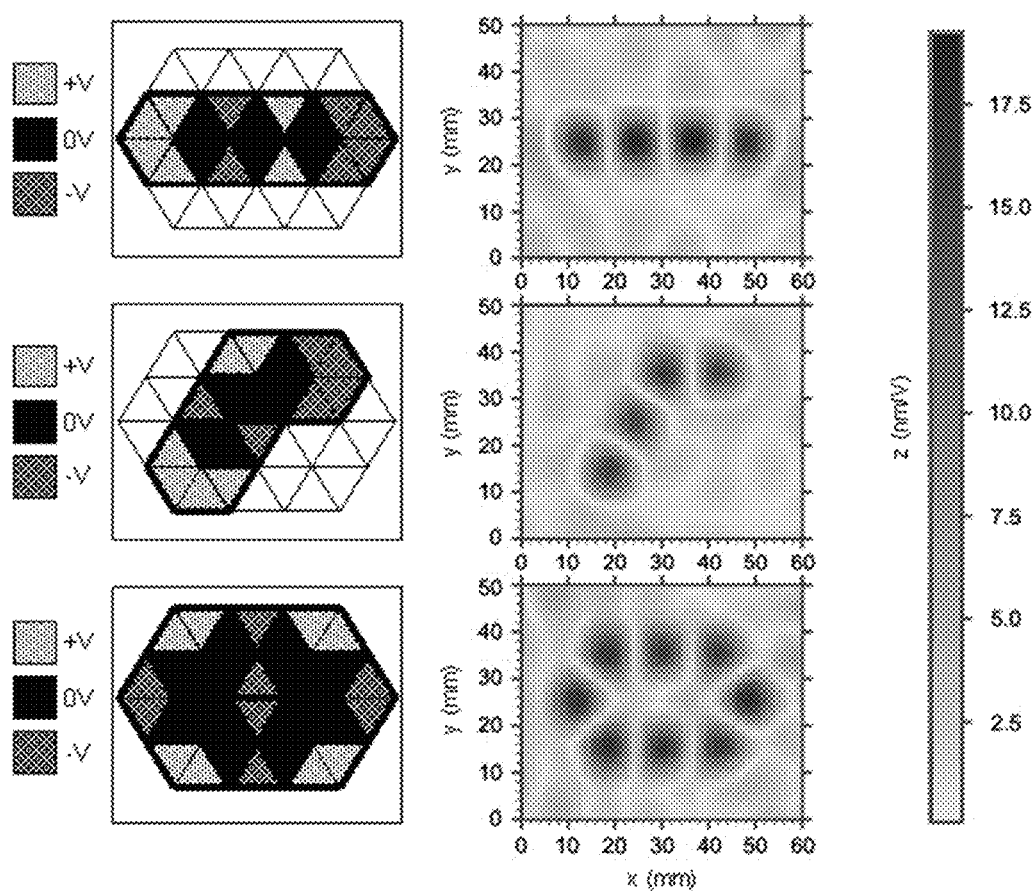
FIG. 8 illustrates four examples of spatial distributions of vibrations on a contact surface obtained by activating several hexagonal actuators using control signals each comprising a carrier signal of non-radiating frequency, when the actuators are in contact and have overlapping common portions of their active surfaces, according to several possible arrangements and numbers of these actuators, and FIG. 9 schematically represents a passive shunt flip-flop electrical circuit for an actuator of a local friction modulation via vibration device according to the present invention.

FIG. 8 shows three further examples:
a first example of four hexagonal actuators aligned in overlapping and controlled in phase opposition two by two, where the resulting power supplies of triangular active surface portions are indicated in medium grey for +V, in dark grey for −V and in black for 0V,
a second example of four hexagonal actuators overlapped and controlled in phase opposition two by two, one of them not being aligned with the other three, where the resulting power supplies of triangular active surface portions are indicated in medium gray for +V, in dark gray for −V and in black for 0V, and
a third example of eight hexagonal actuators overlapped and controlled in phase opposition two by two, arranged in an oblong arrangement, where the resulting power supplies of triangular active surface portions are indicated in medium grey for +V, dark grey for −V and black for 0V.

Fairly homogeneous localized vibration patterns can be observed for optimum energy consumption. Lateral dimensions of the contact surface are expressed in mm, while vibration amplitudes are expressed in nm/V.

In view of the hexagonal shape of the actuators in the examples shown in FIGS. 7A, 7B and 8, residual vibrations can still be observed on the contact surface, albeit very attenuated, outside the zones covered by the actuators activated by the control signals.

It is therefore optionally proposed to use the remaining actuators, i.e. those which are not used, to passively attenuate these residual vibrations. For this purpose, each actuator is coupled to at least one passive shunt flip-flop system. Even more precisely, it is advantageous in practice to couple each electrode cut from the upper conductive layer, i.e. each active surface portion of each actuator, to a passive shunt flip-flop system.

Figure 9:
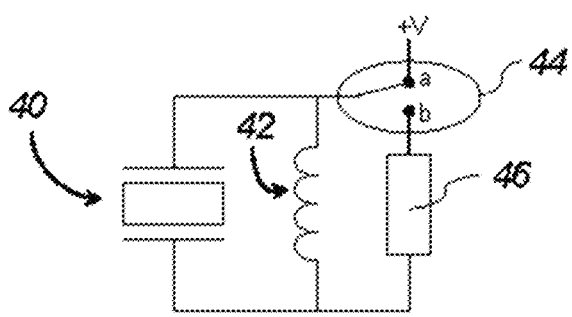

A simple example of such a coupling is shown schematically in the form of an equivalent electrical circuit in FIG. 9. The coupled actuator, or the coupled actuator's active surface portion, is modeled there by a capacitor 40 to which an inductor 42 may optionally be associated in parallel. This assembly is connected to a flip-flop or switch 44, enabling the actuator or the actuator's active surface portion either to be activated by connecting it to a control signal (+V) in position a of switch 44, or by short-circuiting it in position b of switch 44 via a dissipative resistor 46 arranged in parallel and forming the passive shunt.

In the presence of inductance 42, the passive shunt is inductive. Otherwise, it is purely resistive.

Noting C the value of capacitance 40 and L the value of inductance 42 when the latter is added, the equivalent electrical impedance Z of the actuator or actuator's active surface portion is:

$$Z = \frac{jL\omega}{1 - LC\omega^2},$$

where j is the pure imaginary such that $j^2=-1$ and $\omega$ is the pulsation corresponding to the chosen non-radiating control frequency.

Thus, by judiciously choosing the value of inductance L such that $L=1/(C\omega^2)$, then the impedance Z is infinite at the chosen non-radiating frequency and the current delivered to power the actuator or actuator's active surface portion is zero. On the other hand, when the actuator or actuator's active surface portion is not in use, it is short-circuited in position b to create a passive shunt and dissipate the mechanical energy of residual vibrations through resistor 46.

It clearly appears that a local friction modulation via vibration device such as the one described above enables the creation of at least one more constant localized vibration field acting on several actuators, with no transition dead zone between the actuators acted on when they are adjacent and overlapped. This is highly advantageous for applications such as localized acoustic lubrication or localized haptic feedback, but also in acoustophoretic micromanipulation.

It should also be noted that the invention is not limited to the above-described embodiments.

In particular, the localized acoustic lubrication patterns can be predetermined on the contact surface 14, as suggested in the previous examples. But they can also move temporally following one or more user fingers when these interactions are localizable by a corresponding system.

Alternatively too, the control signals can have different non-radiating carrier frequencies, particularly from one acoustic lubrication zone to another. They may even each have several non-radiating carrier frequencies.

More generally, it will be apparent to those skilled in the art that various modifications can be made to the embodiments described above, in the light of the teaching just disclosed to them. In the foregoing detailed presentation of the invention, the terms used are not to be construed as limiting the invention to the embodiments set forth in the present description, but are to be interpreted to include all equivalents the anticipation of which is within the reach of those skilled in the art by applying their general knowledge to the implementation of the teaching just disclosed to them.

The invention claimed is:
1. A device for local friction modulation via vibration, comprising:
a vibrating interface having a contact surface and a lower surface, and defining a transverse direction between the contact surface and the lower surface;
a plurality of actuators with active surfaces, the active surfaces being materialized for each of them by a common surface of each of their lower and upper electrodes facing each other and being arranged against the vibrating interface, the plurality of actuators being designed to vibrate the vibrating interface in the transverse direction by emitting mechanical bending waves to create at least one local friction modulation on the contact surface; and a generator of a plurality of control signals for controlling the plurality of actuators;

each control signal comprising a carrier signal at a non-radiating frequency for one of the plurality of actuators that said each control signal controls, being at a frequency wherein destructive interference from the emitted mechanical bending waves is generated outside a zone of the contact surface covered by said one of the plurality of actuators, so that an amplitude of vibrations generated by said one of the plurality of actuators outside said covered zone of the contact surface covered by said one of the plurality of actuators is at least 10 decibels less than a maximum amplitude of the vibrations generated by said one of the plurality of actuators in said covered zone of the contact surface covered by said one of the plurality of actuators; and wherein at least two of the plurality of actuators share an overlapping common portion of their active surfaces.

2. The device for local friction modulation via vibration according to claim 1, wherein the plurality of actuators are arranged in a double tiling of their circular active surfaces of equal radius R:
 a first matrix tiling wherein each active surface touches its neighbor(s) at a point;
 a second matrix tiling identical to but overlapped with the first matrix tiling by shifting a distance equal to the radius R in both row and column directions of the first matrix tiling.

3. The device for local friction modulation via vibration according to claim 1, wherein the plurality of actuators are arranged in a triple tiling of their hexagonal active surfaces of equal length L of each hexagon side:
 a first honeycomb tiling wherein each active surface touches its neighbor(s) on one side;
 two other honeycomb tilings identical but overlapped with the first honeycomb tiling by shifting a distance equal to the length L in two of three directions defined by the hexagons of the first honeycomb tiling.

4. The device for local friction modulation via vibration according to claim 2, wherein the tiling overlapping constitutes juxtaposed active surfaces portions cut out in an upper conductive layer, each belonging to one or more of the plurality of actuators, and materialized by a layer of electrodes, one per active surface portion, each electrode being supplied by an additive contribution of one or more control signals of the one or more of the plurality of actuators associated with the active surface portion it materializes.

5. The device for local friction modulation via vibration according to claim 3, wherein:
 the tiling overlapping constitutes juxtaposed active surfaces portions cut out in an upper conductive layer, each belonging to one or more of the plurality of actuators, and materialized by a layer of electrodes, one per active surface portion, each electrode being supplied by an additive contribution of one or more control signals of the one or more of the plurality of actuators associated with the active surface portion it materializes; and
 wherein each active surface portion is triangular, thus forming a regular triangular cut-out of electrodes resulting from the overlapping of the three honeycomb tilings, and belongs to at most three hexagonal actuators centered respectively at most on its three vertices, through each of which it is combined with five other triangular surface portions to form each one of the plurality of actuators to which it belongs.

6. The device for local friction modulation via vibration according to claim 1, wherein at least two of the plurality of actuators sharing an overlapping common portion of their active surfaces have their respective control signals generated in phase opposition.

7. The device for local friction modulation via vibration according to claim 1, wherein the generator of control signals is designed to generate periodic signals frequency-centered on their non-radiating frequency and modulated at low frequency according to at least one modulation frequency less than or equal to 1 kHz.

8. The device for local friction modulation via vibration according to claim 1, wherein each of the plurality of actuators is coupled to a passive shunt flip-flop system.

9. The device for local friction modulation via vibration according to claim 1, wherein each of the plurality of the actuators comprise ultrasonic transducers, in particular piezoelectric or magnetostrictive transducers.

10. The device for local friction modulation via vibration according to claim 1, wherein the vibrating interface comprises a display plate with organic light-emitting diode technology.

* * * * *